(12) United States Patent
Bennett

(10) Patent No.: US 8,405,424 B2
(45) Date of Patent: Mar. 26, 2013

(54) OUTPUT BUFFER WITH ADJUSTABLE FEEDBACK

(75) Inventor: Christopher A. Bennett, Topsham, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/156,067

(22) Filed: Jun. 8, 2011

(65) Prior Publication Data

US 2012/0313663 A1   Dec. 13, 2012

(51) Int. Cl.
*H03K 19/0175* (2006.01)

(52) U.S. Cl. ............................................ 326/83; 326/27

(58) Field of Classification Search .................... None
See application file for complete search history.

(56) References Cited

U.S. PATENT DOCUMENTS

| | | | |
|---|---|---|---|
| 5,438,278 A | 8/1995 | Wong et al. | |
| 5,854,560 A * | 12/1998 | Chow | 326/27 |
| 5,910,730 A * | 6/1999 | Sigal | 326/24 |
| 6,154,058 A | 11/2000 | Sawai | |
| 6,414,524 B1 | 7/2002 | Chen | |
| 6,570,414 B1 | 5/2003 | Eker | |
| 6,653,873 B1 | 11/2003 | Nguyen | |
| 7,312,626 B2 | 12/2007 | Forbes | |
| 7,449,913 B1 | 11/2008 | Hung | |
| 7,843,234 B2 | 11/2010 | Srinivas et al. | |
| 2009/0195270 A1 * | 8/2009 | Lin | 326/82 |
| 2010/0259298 A1 | 10/2010 | Huang et al. | |

* cited by examiner

*Primary Examiner* — Crystal L Hammond
(74) *Attorney, Agent, or Firm* — Grossman Tucker Perreault & Pfleger PLLC

(57) ABSTRACT

A system according to one embodiment includes input stage circuitry configured to receive input data; output stage circuitry configured to generate buffered output data based on said received input data, said output stage circuitry comprising a first switch and a second switch, wherein said first switch comprises a first gate configured to control said first switch through an inverted gate signal and said second switch comprises a second gate configured to control said second switch through a non-inverted gate signal; first feedback inverter circuitry configured to enable pull-up of said second gate based on an input to said first gate, said first feedback inverter circuitry is further configured to provide an adjustable transition threshold for generation of said pull-up enable; and second feedback inverter circuitry configured to enable pull-down of said first gate based on an input to said second gate, said second feedback inverter circuitry is further configured to provide an adjustable transition threshold for generation of said pull-down enable.

14 Claims, 5 Drawing Sheets

SYSTEM TRUTH TABLE 200

| 202 INPUT DATA | 204 OUTPUT ENABLE | 206 I_PFB | 208 I_NFB | 210 MPOUT | 212 MNOUT | 214 OUTPUT PAD |
|---|---|---|---|---|---|---|
| 0 | 0 | 0 | 1 | OFF | OFF | HI IMPEDANCE |
| 1 | 0 | 0 | 1 | OFF | OFF | HI IMPEDANCE |
| 0 | 1 | 0 | 0 | OFF | ON | 0 |
| 1 | 1 | 1 | 1 | ON | OFF | 1 |

FIG. 2

OUTPUT BUFFER WITH ADJUSTABLE FEEDBACK

FIELD

The present disclosure relates to an output buffer, and more particularly, to an output buffer having adjustable feedback to reduce crowbar current.

BACKGROUND

Buffer circuits are widely used in many digital systems, and generally provide impedance matching, edge setting and level adjusting functions between an input signal and other circuitry, for example, other circuitry associated with an integrated circuit (IC). Output buffers may include one or more switching stages that switch in response to an input signal. Combinations of switches may sometimes be turned on simultaneously or for overlapping periods of time, resulting in crowbar currents through these switching paths directly between supply voltage and ground. The presence of crowbar currents in the buffer can unnecessarily increase the overall power draw of the circuit, which in turn, may cause power supply noise and droop, limit battery life and create thermal management issues.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

FIG. 2 illustrates a truth table for an output buffer consistent with one exemplary embodiment of the present disclosure;

Although the following Detailed Description will proceed with reference being made to illustrative embodiments, many alternatives, modifications, and variations thereof will be apparent to those skilled in the art.

DETAILED DESCRIPTION

Generally, this disclosure provides output buffer systems and methods that employ adjustable feedback techniques to limit overlapping turn-on times of output buffer switches. This reduces crowbar current (ICCT) through the output switches resulting in reduced overall power draw of the circuit, reduced power supply noise and increased battery life. Advantageously, the output buffer systems of the present disclosure provide reduced ICCT without requiring fixed delay break-before-make techniques. Rather, the adjustable feedback techniques of the present disclosure enable the delay between gate switches to adjust and compensate for changing load conditions on the output switches that affect the output switch transition times.

Figure 1:
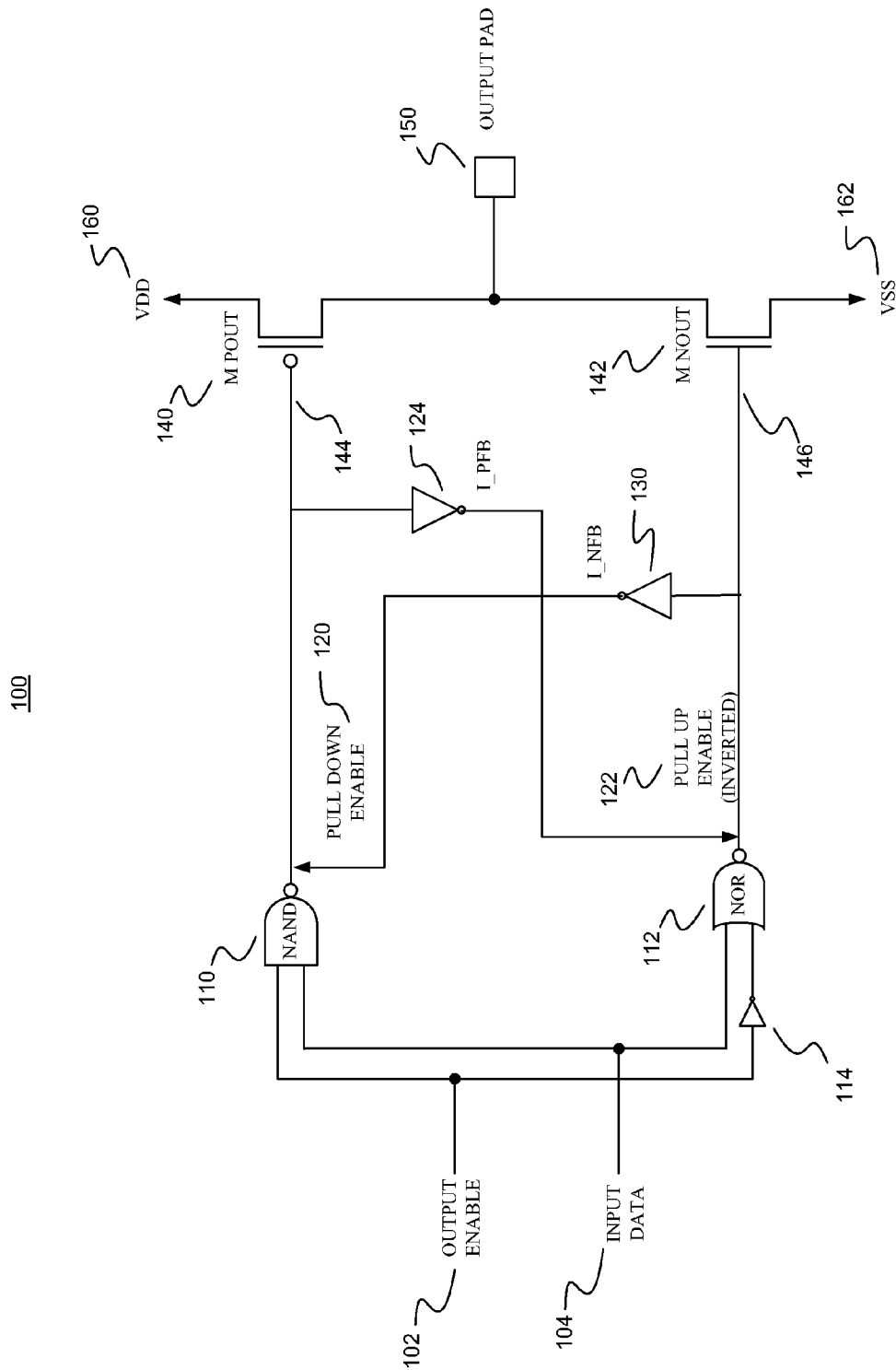
FIG. 1 illustrates a logic block diagram of one exemplary embodiment consistent with the present disclosure.

FIG. 1 illustrates a logic block diagram 100 of one exemplary embodiment consistent with the present disclosure. Logic block diagram 100 generally includes an input data path 104, an output enable path 102 and an output pad 150 for the buffered output. Positive and negative power supply rail voltages VDD 160 and VSS 162, respectively, are also shown. The state of the output pad 150 is controlled by output switches MPOUT 140 and MNOUT 142, which in turn are controlled by input data 104 and output enable 102 as will be explained later. When MPOUT 140 is switched on and MNOUT 142 is switched off, the output pad 150 will be High (VDD 160) representing a logic 1 value. When MPOUT 140 is switched off and MNOUT 142 is switched on, the output pad 150 will be Low (VSS 162) representing a logic 0 value. If both switches 140, 142 are off, the output pad 150 will be in a high impedance state. If both switches 140, 142 are on, crowbar current (ICCT) will flow through the switches 140, 142 from VDD 160 to VSS 162. It is generally desirable to reduce the length of time during which either of these last two conditions, high impedance and ICCT, may occur. Two feedback paths are provided, through inverters I_PFB 124 and I_NFB 130, to accomplish this as will be explained below.

Switch MPOUT 140 is controlled through an inverted version of gate signal 144. Switch MNOUT 142 is controlled through (non-inverted) gate signal 146. I_PFB 124 feeds back an inverted version of the MPOUT gate signal 144 to be used as an inverted pull-up enable 122 to gate signal 146 of switch MNOUT 142. In other words, when MPOUT 140 is switched off, I_PFB 124 will transition to Low which will cause inverted pull-up enable 122 to pull-up gate signal 146 of switch MNOUT 142 turning it on.

Similarly, I_NFB 130 feeds back an inverted version of the MNOUT gate signal 146 to be used as a pull-down enable 120 to gate signal 144 of switch MPOUT 140. In other words, when MNOUT 142 is switched off, I_NFB 130 will transition to High which will cause pull-down enable 120 to pull-down gate signal 144 of switch MPOUT 140. Since MPOUT 140 is controlled through an inverted version of gate signal 144, this pull-down of gate signal 144 turns MPOUT 140 on.

These feedback paths, through I_NFB 130 and I_PFB 124, may therefore ensure that switches MPOUT 140 and MNOUT 142 are not simultaneously turned on resulting in unwanted ICCT. These feedback signals, however, do not change instantaneously. Generally, there are ramp up and ramp down times which may depend on circuit loading conditions. There are also voltage threshold switching points on these ramps that may be adjusted, for example based on the physical geometry of the devices. These factors may be used to determine and adjust relative delays between switching of output buffer switches MPOUT 140 and MNOUT 142 as will be explained in greater detail below.

Also illustrated in FIG. 1 are additional logic circuitry comprising NAND gate 110, NOR gate 112, and inverter 114. This logic circuitry is provided to handle the output enable signal 102. In some circumstances it may be useful to disable the buffering of the input data 104 to the output pad 150, by holding the output pad 150 in a high impedance state. If output enable 102 goes Low, NAND gate 110 goes High and NOR gate 112 goes Low (due to the inversion of output enable 102 by inverter 114), regardless of the state of input data. With the output of NAND gate 110 being High, gate signal 144 of switch MPOUT 140 will be High and therefore, since MPOUT 140 is controlled through an inverted version of gate signal 144, MPOUT 140 will be switched off. Additionally, with the output of NOR gate 112 being Low, gate signal 146 of switch MNOUT 142 will be Low and therefore MNOUT 142 will be switched off. With both switches MPOUT 140 and MNOUT 142 being off, output pad 150 will float in a high impedance state and input data 104 will not be reflected at the output of the buffer.

FIG. 2 illustrates a truth table 200 for an output buffer consistent with one exemplary embodiment of the present disclosure. Truth table 200 summarizes the states of the key signals as described above with respect to logic block diagram 100. The columns of truth table 200, from left to right, list input data 202, output enable, 204, I_PFB 206, I_NFB 208, MPOUT 210, MNOUT 212 and output pad 214. As can be seen, when output enable 204 is Low, both MPOUT 210 and MNOUT 212 are switched off and the output pad 214 will be in a high impedance state. When output enable 204 is High, I_PFB 206 and I_NFB 208 achieve a state that matches the input data 202. In this case, when input data 202 is Low, MPOUT 210 is switched off and MNOUT 212 is switched on, resulting in output pad 214 going Low which matches input data 202. Similarly, when input data 202 is High, MPOUT 210 is switched on and MNOUT 212 is switched off, resulting in output pad 214 going High which matches input data 202.

Figure 3:
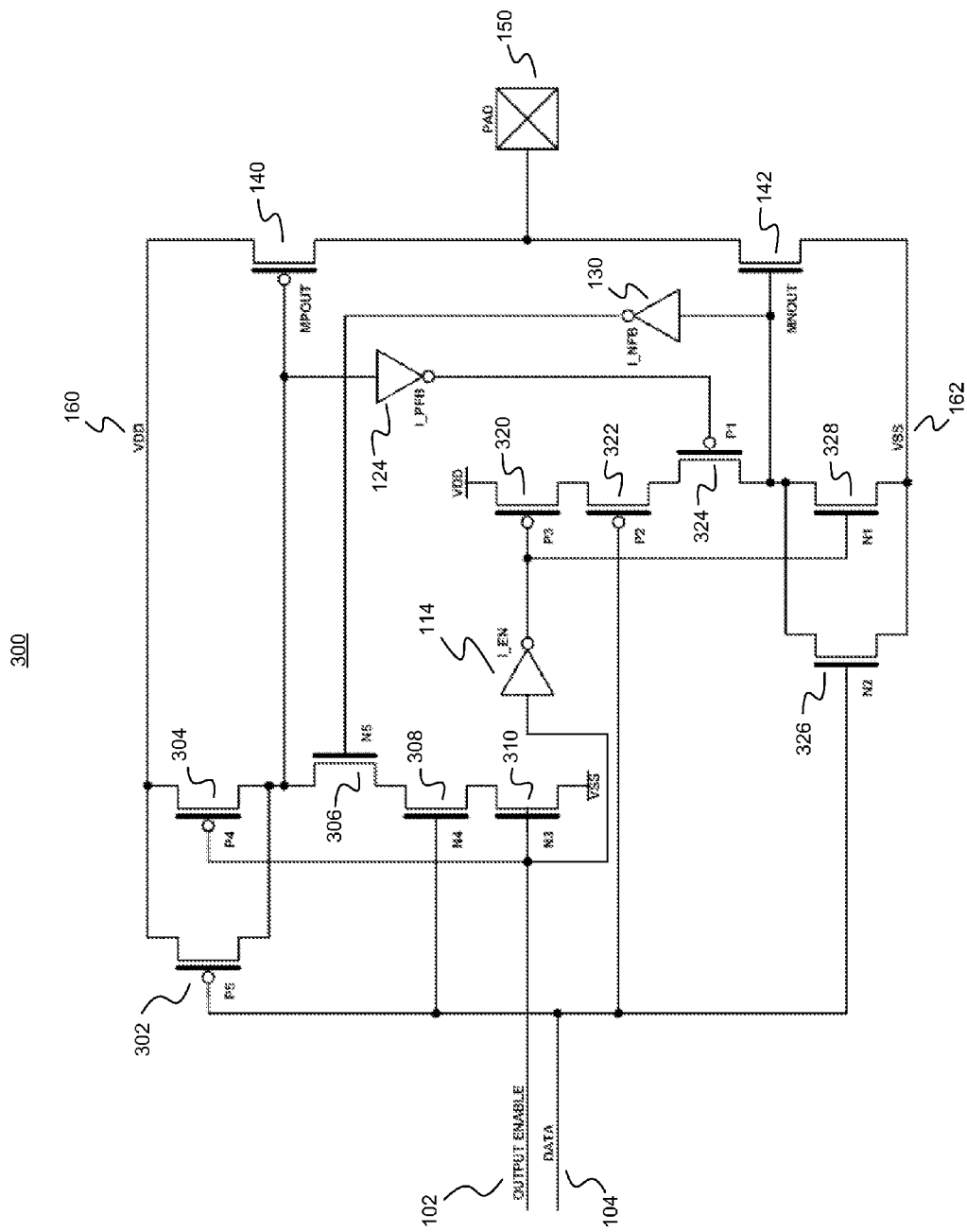
FIG. 3 illustrates a circuit diagram of one exemplary embodiment consistent with the present disclosure.

FIG. 3 illustrates a circuit diagram 300 of one exemplary embodiment consistent with the present disclosure. The circuit 300 is a more detailed illustration of the logic block diagram of FIG. 1, where NAND gate 110 and NOR gate 112 have been expanded to detail the underlying PMOS and NMOS gates.

NAND gate 110 is comprised of PMOS P5 302, PMOS P4 304, NMOS N5 306, NMOS N4 308 and NMOS N3 310. Output enable 102 gates NMOS N3 310 and PMOS P4 304. Input data 104 gates PMOS P5 302 and NMOS N4 308. Feedback from I_NFB 130 provides a pull-down enable to NMOS N5 306. The output of the NAND gate 110 is tapped off the connection point between PMOS P4 304 and NMOS N5 306.

NOR gate 112 is comprised of PMOS P3 320, PMOS P2 322, PMOS P1 324, NMOS N2 326 and NMOS N1 328. Output enable 102 goes through inverter 114 and then gates PMOS P3 320 and NMOS N1 328. Input data 104 gates PMOS P2 322 and NMOS N2 326. Feedback from I_PFB 124 provides a pull-up enable to inverted gate of PMOS P1 324. The output of the NOR 112 gate is tapped off the connection point between PMOS P1 324 and NMOS N1 328.

Figure 4:
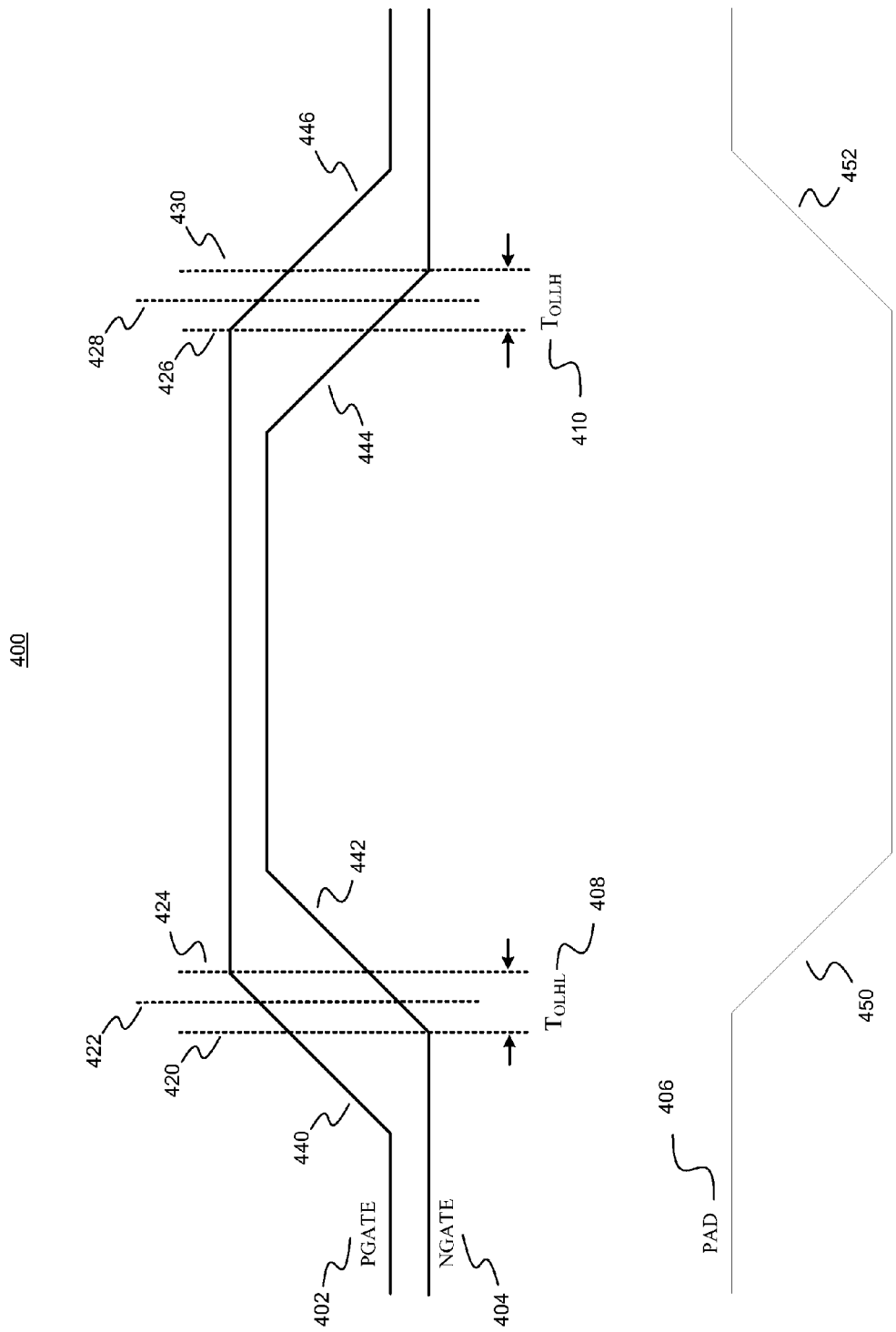
FIG. 4 illustrates a timing diagram for an output buffer consistent with one exemplary embodiment of the present disclosure.

FIG. 4 illustrates a timing diagram 400 for an output buffer consistent with one exemplary embodiment of the present disclosure. The baseline for the timing diagram 400 is a plot of the output pad voltage 406 illustrating a High to Low transition 450 followed by a Low to High transition 452. Plotted above this, are the PGATE voltage 402, which represents the inverted version of gate signal 144 to MPOUT switch 140, and the NGATE voltage 404 which represents the gate signal 146 to MNOUT switch 142.

When PGATE 402 is Low and NGATE 404 is Low, MPOUT switch 140 is on and MNOUT switch 142 is off which drives output pad 406 High.

As PGATE 402 rises from Low to High 440, it passes through a transition voltage $V_{tP}$ at 420 where MPOUT 140 switches from on to off. Similarly as NGATE 404 rises from Low to High 442, it passes through a transition voltage $V_{tN}$ at 424 where MNOUT 142 switches from off to on. $T_{OLHL}$ 408 is the time interval during which MPOUT 140 and MNOUT 142 are both switched off and the output pad 406 will be in a high impedance state. If $V_{tp}$ at 420 were shifted in time to the right of $V_{tN}$ at 424, then $T_{OLHL}$ 408 would represent the time interval during which MPOUT 140 and MNOUT 142 are both switch on resulting in crowbar current ICCT flowing through MPOUT 140 and MNOUT 142. Since neither of these conditions are desirable, $T_{OLHL}$ 408 may be reduced by shifting $V_{tP}$ at 420 and $V_{tN}$ at 424 as close as possible to an optimal common point 422 where $V_{tN}=V_{tP}$. This may be accomplished by adjusting the feedback transition thresholds of I_PFB 124 and I_NFB 130 to add or subtract delay to transition point 424 and 420 respectively.

A similar situation exists during the transition of output pad 406 from Low to High 452. As PGATE 402 falls from High to Low 446, it passes through a transition voltage $V_{tP}$ at 430 where MPOUT 140 switches from off to on. Similarly as NGATE 404 falls from High to Low 444, it passes through a transition voltage $V_{tN}$ at 426 where MNOUT 142 switches from on to off. $T_{OLLH}$ 410 is the time interval during which MPOUT 140 and MNOUT 142 are both switched off and the output pad 406 will be in a high impedance state. If $V_{tP}$ at 430 were shifted in time to the left of $V_{tN}$ at 426, then $T_{OLLH}$ 410 would represent the time interval during which MPOUT 140 and MNOUT 142 are both switch on resulting in crowbar current ICCT flowing through MPOUT 140 and MNOUT 142. Since neither of these conditions are desirable, $T_{oLLH}$ 410 may be reduced by shifting $V_{tP}$ at 430 and $V_{tN}$ at 426 as close as possible to an optimal common point 428 where $V_{tN}=V_{tP}$. This may be accomplished by adjusting the feedback transition thresholds of I_PFB 124 and I_NFB 130 to add or subtract delay to transition point 426 and 430 respectively.

Figure 5:
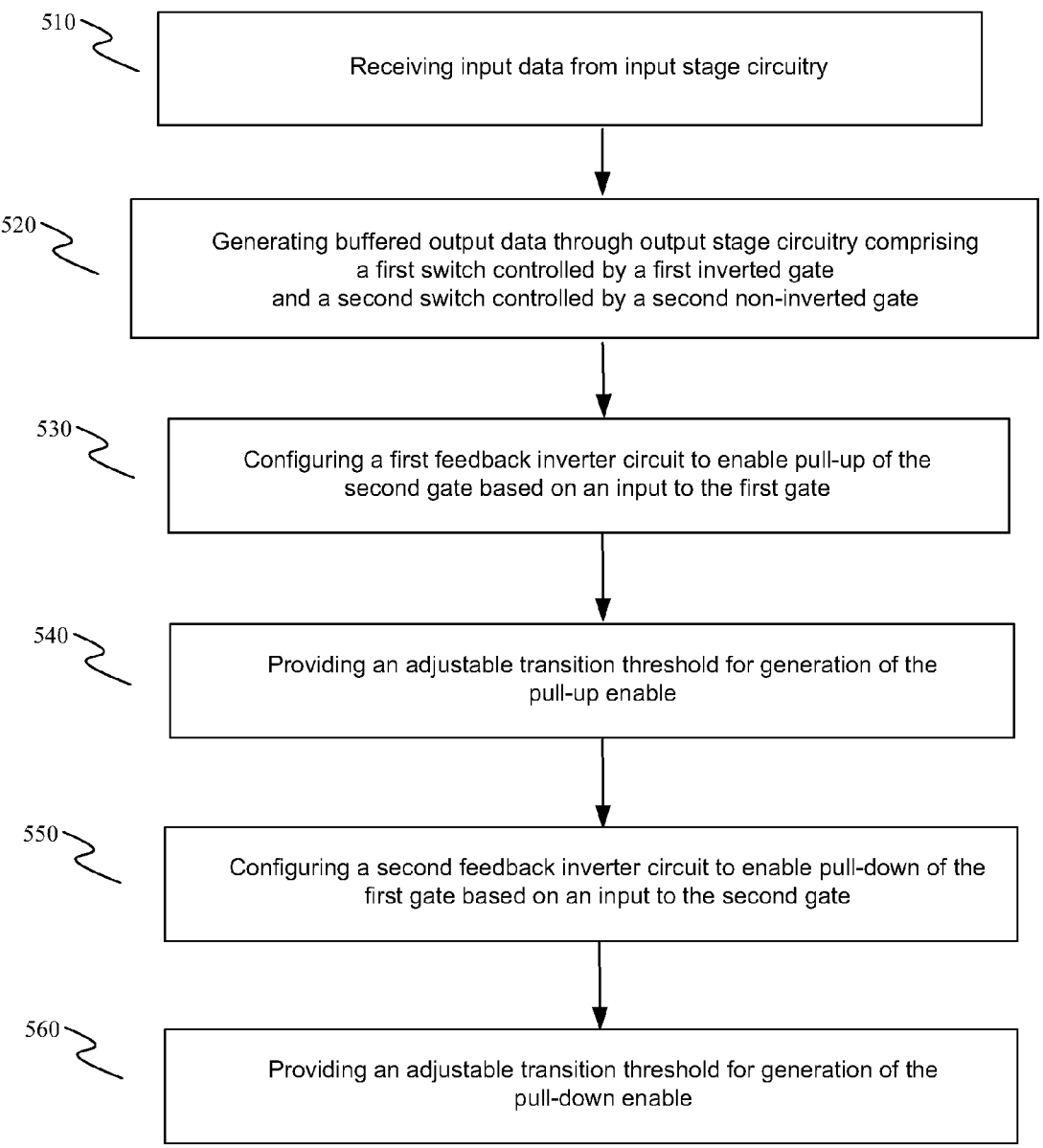
FIG. 5 illustrates a flowchart of operations of one exemplary embodiment consistent with the present disclosure.

FIG. 5 illustrates a flowchart of operations 500 of one exemplary embodiment consistent with the present disclosure. At operation 510, input data is received from input stage circuitry. At operation 520, buffered output data is generated through output stage circuitry comprising a first switch controlled by a first inverted gate and a second switch controlled by a second non-inverted gate. At operation 530 a first feedback inverter circuit is configured to enable pull-up of the second gate based on an input to the first gate. At operation 540, an adjustable transition threshold is provided for generation of the pull-up enable. At operation 550, a second feedback inverter circuit is configured to enable pull-down of the first gate based on an input to the second gate. At operation 560, an adjustable transition threshold is provided for generation of the pull-down enable.

"Circuitry", as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An output buffer system, comprising:
input stage circuitry configured to receive input data;
output stage circuitry configured to generate buffered output data based on said received input data, said output stage circuitry comprising a first switch and a second switch, wherein said first switch comprises a first gate configured to control said first switch through an inverted gate signal and said second switch comprises a second gate configured to control said second switch through a non-inverted gate signal;

first feedback inverter circuitry configured to enable pull-up of said second gate based on an input to said first gate, said first feedback inverter circuitry is further configured to provide an adjustable voltage threshold switching point for generation of said pull-up enable; and second feedback inverter circuitry configured to enable pull-down of said first gate based on an input to said second gate, said second feedback inverter circuitry is further configured to provide an adjustable voltage threshold switching point for generation of said pull-down enable.

2. The output buffer system of claim 1, wherein, during a High to Low transition of said output data, said pull-up enable of said second gate imparts a turn-on delay to said second switch such that said second switch turns on after said first switch turns off.

3. The output buffer system of claim 2, wherein, during a Low to High transition of said output data, said pull-down enable of said first gate imparts a turn-on delay to said first switch such that said first switch turns on after said second switch turns off.

4. The output buffer system of claim 3, wherein said turn-on delays reduce crowbar current through said first and second switches.

5. The output buffer system of claim 3, wherein said turn-on delay to said first switch is controlled by said adjustable voltage threshold switching point for generation of said pull-down enable, and said turn-on delay to said second switch is controlled by said adjustable voltage threshold switching point for generation of said pull-up enable.

6. The output buffer system of claim 1, further comprising output enable circuitry configured to receive an output enable signal and to maintain said buffered output data in a high impedance state based on a value of an output enable signal.

7. The output buffer system of claim 1, wherein said first switch is a PMOS device and said second switch is an NMOS device.

8. A method, comprising
receiving input data from input stage circuitry;
generating buffered output data through output stage circuitry configured to generate said buffered output data based on said receive input data, said output stage circuitry comprising a first switch and a second switch, wherein said first switch comprises a first gate configured to control said first switch through an inverted gate signal and said second switch comprises a second gate configured to control said second switch through a non-inverted gate signal;

configuring first feedback inverter circuitry to enable pull-up of said second gate based on an input to said first gate, said first feedback inverter circuitry is further configured to provide an adjustable voltage threshold switching point for generation of said pull-up enable; and configuring second feedback inverter circuitry to enable pull-down of said first gate based on an input to said second gate, said second feedback inverter circuitry is further configured to provide an adjustable voltage threshold switching point for generation of said pull-down enable.

9. The method of claim 8, wherein during a High to Low transition of said output data, said pull-up enable of said second gate imparts a turn-on delay to said second switch such that said second switch turns on after said first switch turns off.

10. The method of claim 9, wherein during a Low to High transition of said output data, said pull-down enable of said first gate imparts a turn-on delay to said first switch such that said first switch turns on after said second switch turns off.

11. The method of claim 10, wherein said turn-on delays reduce crowbar current through said first and second switches.

12. The method of claim 10, wherein said turn-on delay to said first switch is controlled by said adjustable voltage threshold switching point for generation of said pull-down enable, and said turn-on delay to said second switch is controlled by said adjustable voltage threshold switching point for generation of said pull-up enable.

13. The method of claim 8, further comprising configuring output enable circuitry to receive an output enable signal and to maintain said buffered output data in a high impedance state based on a value of an output enable signal.

14. The method of claim 8, wherein said first switch is a PMOS device and said second switch is an NMOS device.

* * * * *